United States Patent
Yamamoto et al.

(10) Patent No.: US 8,431,465 B2
(45) Date of Patent: Apr. 30, 2013

(54) SEMICONDUCTOR DEVICE AND METHOD FOR FABRICATING THE SAME

(75) Inventors: Hiroshi Yamamoto, Tokyo (JP); Mitsuru Yoshikawa, Tokyo (JP)

(73) Assignee: MagnaChip Semiconductor, Ltd., Chungcheongbuk-do (KR)

(*) Notice: Subject to any disclaimer, the term of this patent is extended or adjusted under 35 U.S.C. 154(b) by 0 days.

(21) Appl. No.: 13/331,536

(22) Filed: Dec. 20, 2011

(65) Prior Publication Data

US 2012/0104504 A1   May 3, 2012

Related U.S. Application Data

(63) Continuation of application No. 12/511,446, filed on Jul. 29, 2009.

(30) Foreign Application Priority Data

Aug. 27, 2008 (KR) .................. 10-2008-0083998

(51) Int. Cl.
*H01L 21/762* (2006.01)
(52) U.S. Cl.
USPC ............... 438/433; 257/506; 257/E21.551
(58) Field of Classification Search ............ 257/506, 257/E21.551; 438/433
See application file for complete search history.

(56) References Cited

U.S. PATENT DOCUMENTS

| | | | |
|---|---|---|---|
| 4,693,781 A | 9/1987 | Leung et al. | |
| 5,904,538 A | 5/1999 | Son et al. | |
| 6,001,707 A | 12/1999 | Lin et al. | |
| 6,143,624 A * | 11/2000 | Kepler et al. | 438/433 |
| 6,245,638 B1 * | 6/2001 | Gardner et al. | 438/424 |
| 6,277,697 B1 * | 8/2001 | Lee | 438/296 |
| 6,599,810 B1 | 7/2003 | Kepler et al. | |
| 6,979,878 B1 | 12/2005 | Gardner et al. | |
| 2002/0076920 A1 | 6/2002 | Kim | |
| 2002/0146890 A1 | 10/2002 | Lee et al. | |
| 2002/0182826 A1 | 12/2002 | Cheng et al. | |
| 2004/0142538 A1 | 7/2004 | Takahashi | |
| 2007/0145495 A1 | 6/2007 | Curello et al. | |

FOREIGN PATENT DOCUMENTS

GB      2 345 578      7/2000

\* cited by examiner

*Primary Examiner* — Steven J Fulk
(74) *Attorney, Agent, or Firm* — Morgan, Lewis & Bockius LLP

(57) ABSTRACT

Provided are a semiconductor device and a fabricating method thereof. The semiconductor device includes a substrate having a trench that defines an active region, an isolation layer that buries the trench, a pro-oxidant region formed at an upper corner portion of the trench to enhance oxidation at the upper corner portion of the trench when a gate insulation layer is grown on the active region, and a gate conductive layer formed on the gate insulation layer.

18 Claims, 20 Drawing Sheets

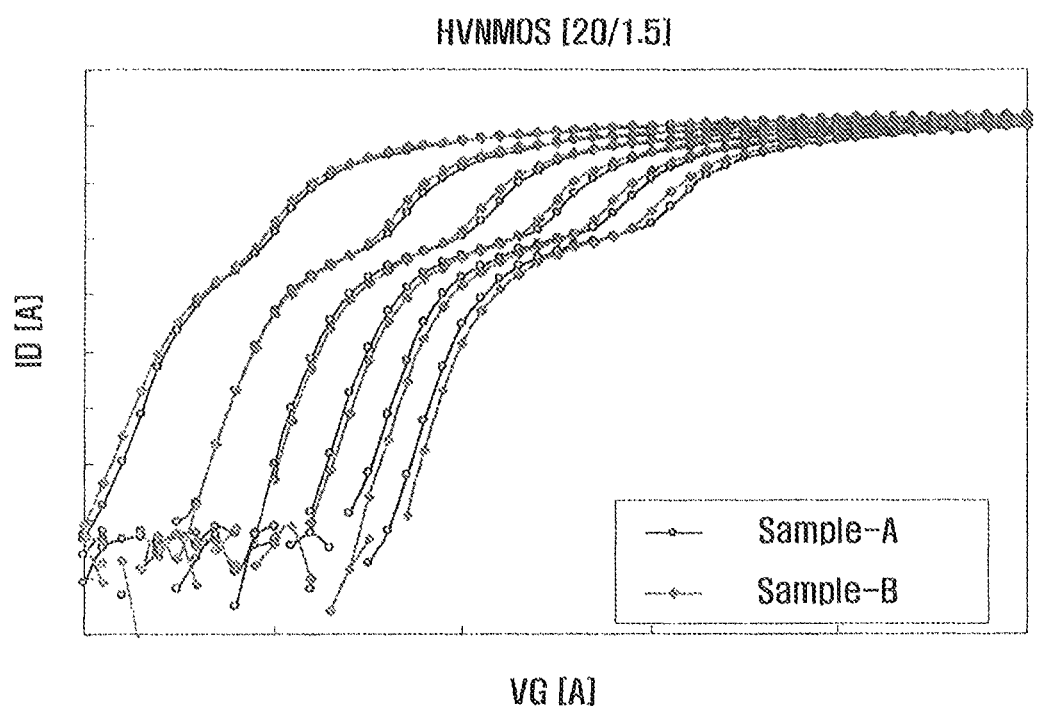

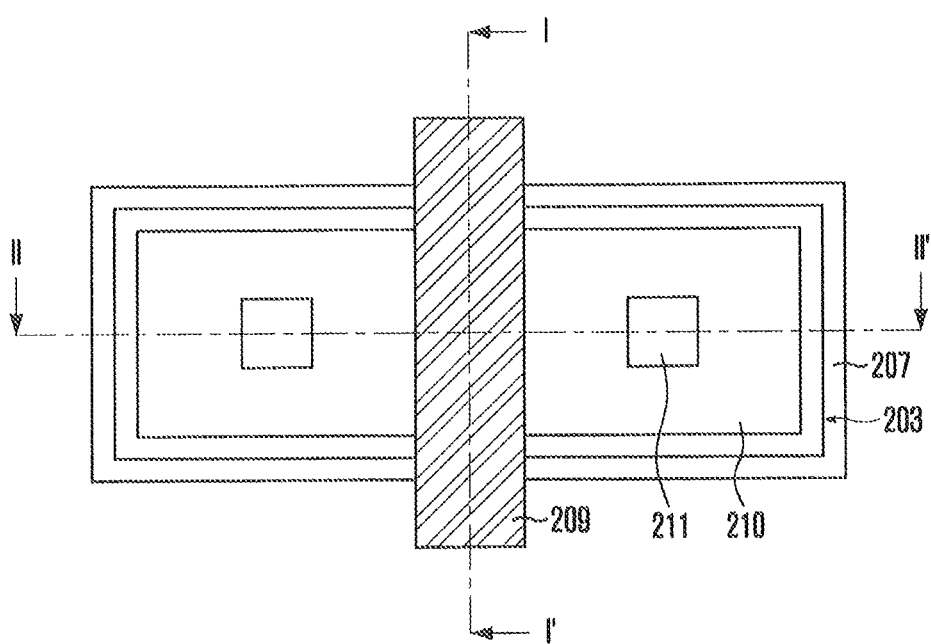

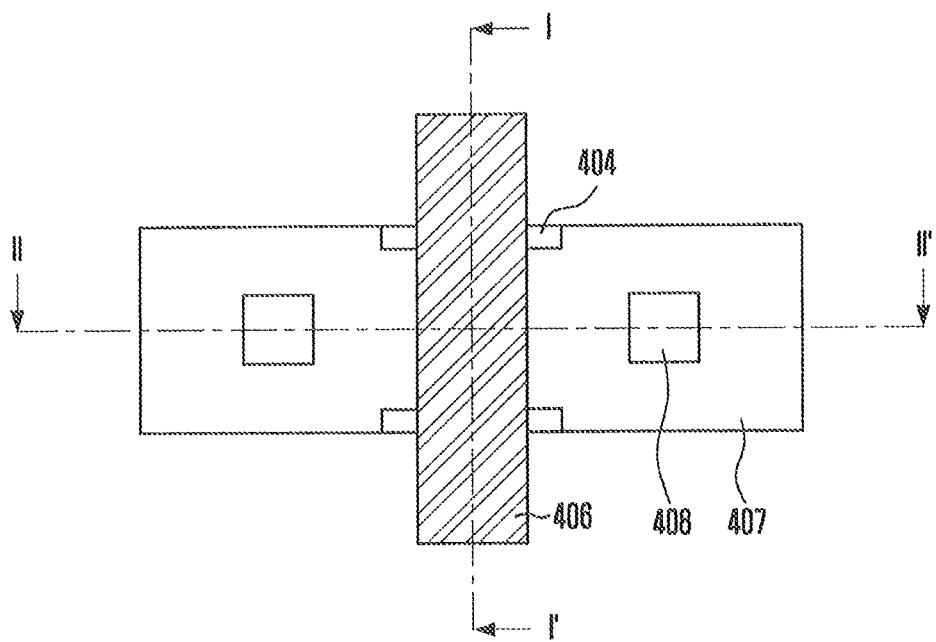

SEMICONDUCTOR DEVICE AND METHOD FOR FABRICATING THE SAME

CROSS-REFERENCE TO RELATED APPLICATIONS

This application is a Continuation of copending U.S. patent application Ser. No. 12/511,446 filed Jul. 29, 2009 and claims the benefit of Korean patent application Number 10-2008-0083998, filed on Aug. 27, 2008, both of which are hereby incorporated by reference in their entirety.

BACKGROUND OF THE INVENTION

1. Field of the Invention

The present invention relates to a method for fabricating a gate of a semiconductor device, and more particularly, to a method for forming an isolation layer for a trench.

2. Description of Related Art

As the integration extent of a semiconductor device increases, many researches have been made to develop a technology for reducing an isolation region. Shallow Trench Isolation (STI) was introduced as an isolation technology for the next generation devices having high integration through flatness of an isolation region and precise design rule.

FIG. 1A is a plane view illustrating a typical gate of a metal oxide semiconductor (MOS) transistor according to the related art, and FIG. 1B is a cross-sectional view illustrating the gate of FIG. 1 taken along the line I-I'. FIGS. 2A to 2H are cross-sectional views illustrating the gate of FIG. 1A taken along the line I-I' for describing a STI process.

As shown in FIG. 2A, a pad oxide layer 102 and a pad nitride layer 104 are formed on a substrate 100.

As shown in FIG. 2B, an etch mask 106 for forming a trench is formed on the pad nitride layer 104.

As shown in FIG. 2C, trenches 108 are formed in the substrate 100 by performing an etch process using the etch mask 106. In the etch process, the pad nitride layer 104, the pad oxide layer 102, and the substrate 100 are partially etched. As a result, a pad nitride pattern 104A, a pad oxide layer pattern 102A, and a substrate 100A internally having the trenches 108 are formed.

As shown in FIG. 2O, the etch mask 106 (see FIG. 2C) is removed.

Then, a sidewall passivation layer 110 is formed on an inner side of the trenches 108.

As shown in FIG. 2E, an insulation layer 112 is deposited until filling up the trenches 108.

As shown in FIG. 2F, a first isolation layer pattern 112A is formed in the trenches 109 by removing the pad nitride layer pattern 104A (see FIG. 2E) after polishing the insulation layer 112 (see FIG. 2E).

As shown in FIG. 2G, the pad oxide layer pattern 102A (see FIG. 2F) is removed by etching the pad oxide layer pattern 102A. In this process, portions of the first isolation layer pattern 112A and the sidewall passivation pattern 110 are also etched to thereby form a second isolation layer pattern 112B and a sidewall passivation pattern 110A Then, a gate insulation layer 114 and a gate conductive layer 116 are formed on an active region 101 of the substrate 100A as shown in FIG. 1B and FIG. 2H. Here, the gate insulation layer 114 is formed by oxidizing the active region 101 through an oxidation process performed in an oxygen ($O_2$) atmosphere.

However, the STI process of the semiconductor device according to the related art has following problems.

In FIG. 2D, the sidewall passivation layer 110 is formed by oxidizing the inner sidewall of the trench through an oxidizing process. Since impurities in the substrate 100A are absorbed at the sidewall passivation layer 110, the impurity concentration of an upper corner portion 120 (see FIG. 2H) of the trench 108 varies. The impurity concentration in the substrate 100A effects the growth of the gate insulation layer 114.

Therefore, the growth of the gate insulation layer becomes thinner than a target thickness at the upper corner portion of the trench 108 as shown in FIG. 3 when the gate insulation layer 114 is grown in FIG. 2H. Accordingly, the gate insulation layer cannot be uniformly grown, a breakdown voltage is reduced and gate oxide integrity (GOI) is deteriorated as shown in FIG. 4.

Furthermore, a parasitic transistor having a threshold voltage lower than an original channel is formed due to the impurity concentration variation of the upper corner portion 120 of the trench 108. Therefore, a leakage current increases when an OFF operation of a transistor is performed. Such a leakage current deteriorates the performance of a transistor that functions as a switching element and degrades threshold voltage mismatching. As shown FIG. 5, a product thereof may perform poor operation because it shows an I-V curve characteristic that cannot be expressed as a SPICE model.

SUMMARY OF THE INVENTION

Embodiments of the present invention are directed to providing a semiconductor device and a fabricating method thereof for forming a gate insulation layer with a uniform thickness by preventing a thin gate insulation layer from forming at an upper corner portion of a trench.

In accordance with an aspect of the present invention, there is provided a semiconductor device including a substrate having a trench that defines an active region, an isolation layer that buries the trench, a pro-oxidant region formed at an upper corner portion of the trench to enhance oxidation at the upper corner portion of the trench when a gate insulation layer is grown on the active region, and a gate conductive layer formed on the gate insulation layer.

In accordance with another aspect of the present invention, there is provided a method for fabricating a semiconductor device including defining an active region by forming a trench in a substrate, forming an isolation layer in the trench, forming a pro-oxidant region at an upper corner portion of the trench, forming a gate insulation layer by oxidizing the active region, and forming a gate conductive layer on the gate insulation layer.

BRIEF DESCRIPTION OF THE DRAWINGS

FIG. 5 is a graph showing I-V character of a semiconductor device according to the related art.

FIG. 6 is a plane view of a semiconductor device in accordance with the first embodiment of the present invention.

FIG. 11 is a plane view of a semiconductor device in accordance with a third embodiment of the present invention.

DESCRIPTION OF SPECIFIC EMBODIMENTS

Figure 1A:
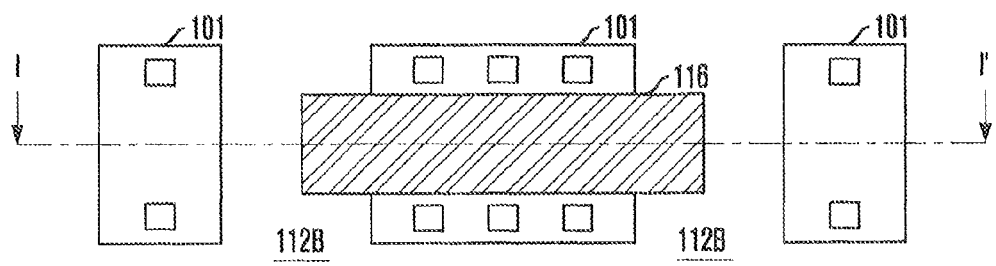
FIGS. 1A and 1B illustrate a typical semiconductor device.
Figure 1B:
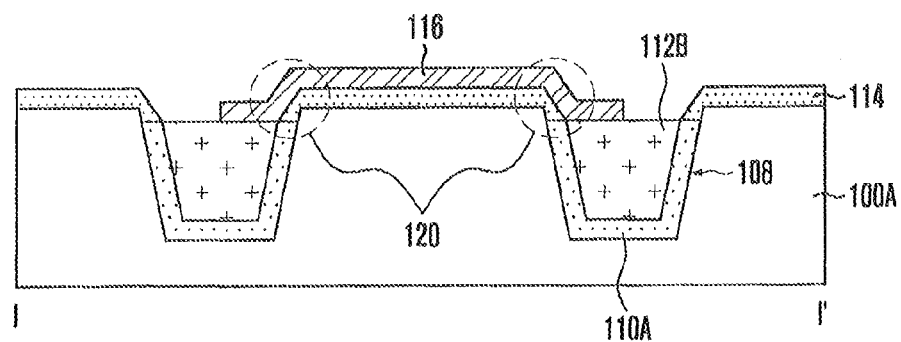
Figure 2A:
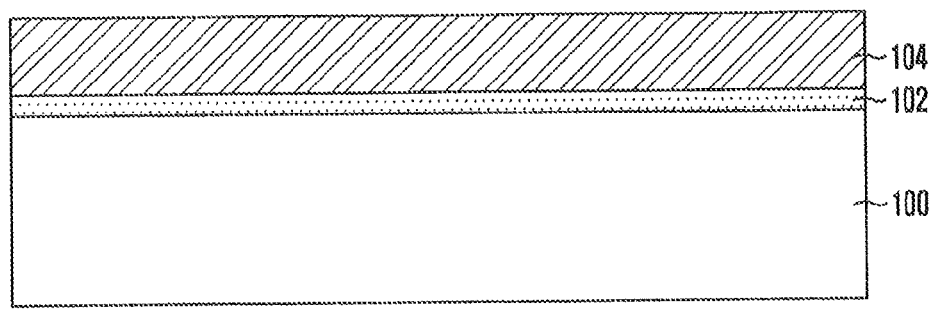
FIGS. 2A to 2H are cross-sectional views of FIG. 1 taken along the line I-I' to describe a method for fabricating a semiconductor device according to the related art.
Figure 2B:
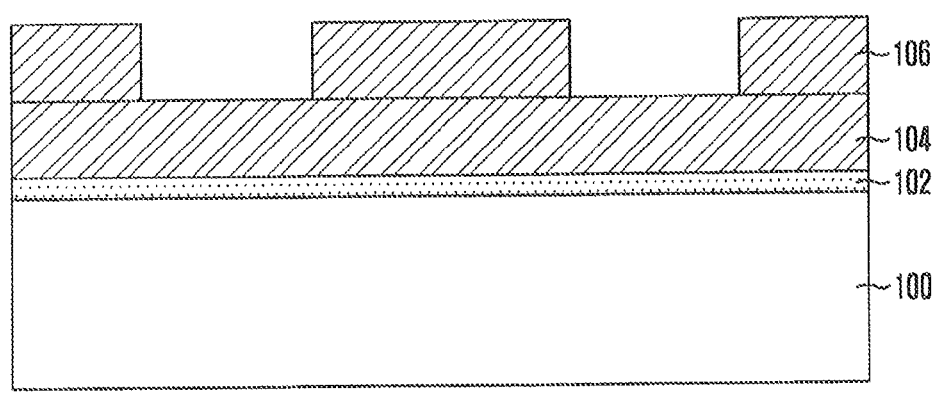
Figure 2C:
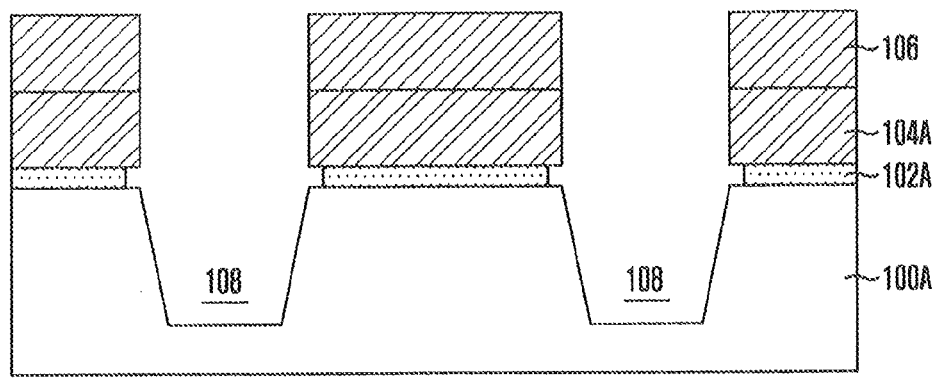
Figure 2D:
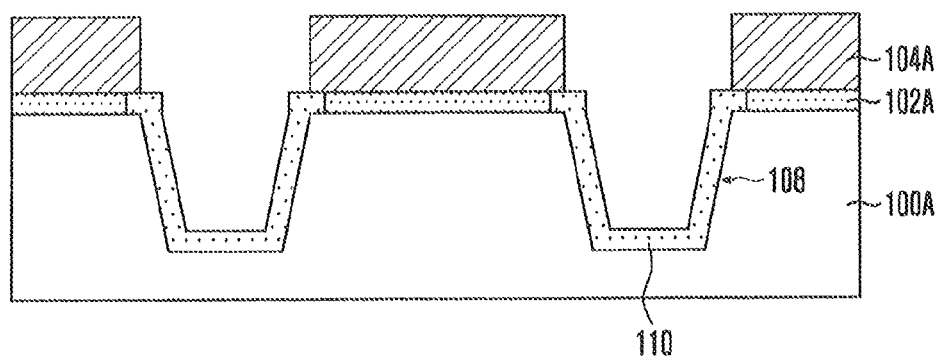
Figure 2E:
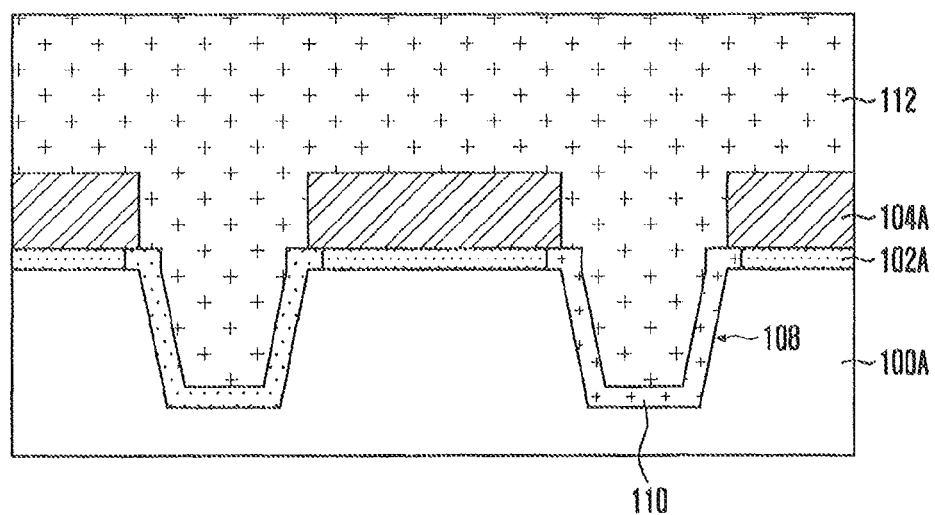
Figure 2F:
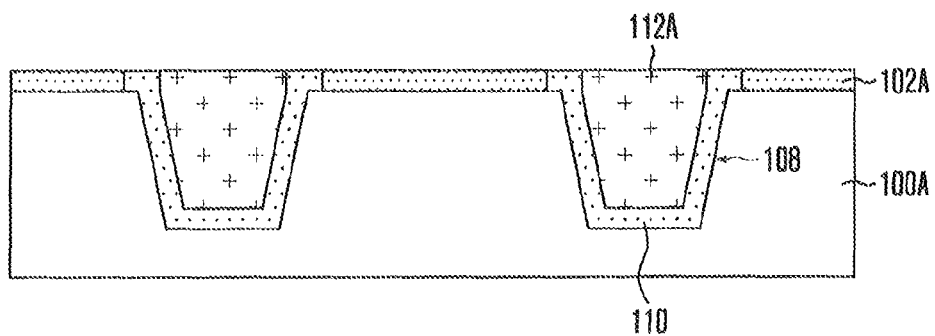
Figure 2G:
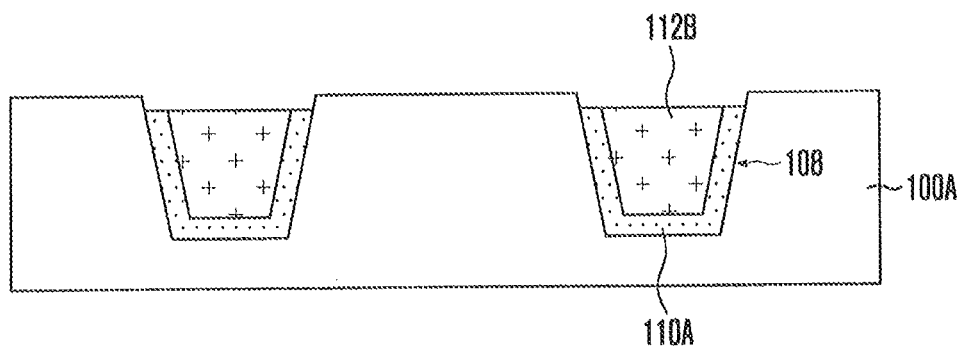
Figure 2H:
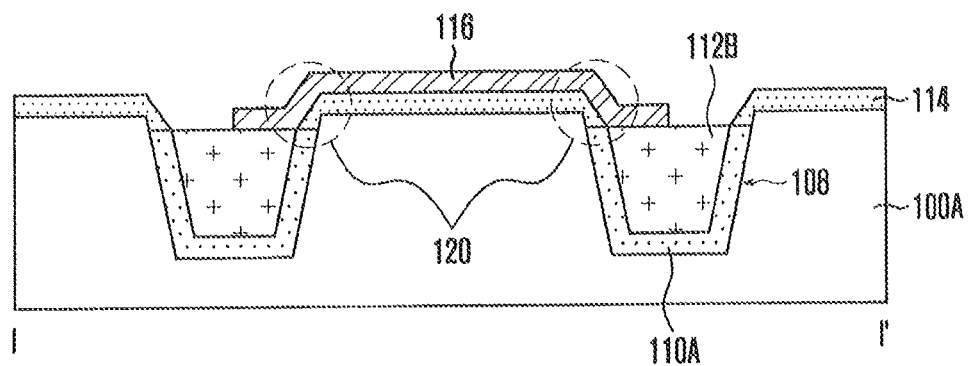
Figure 3:
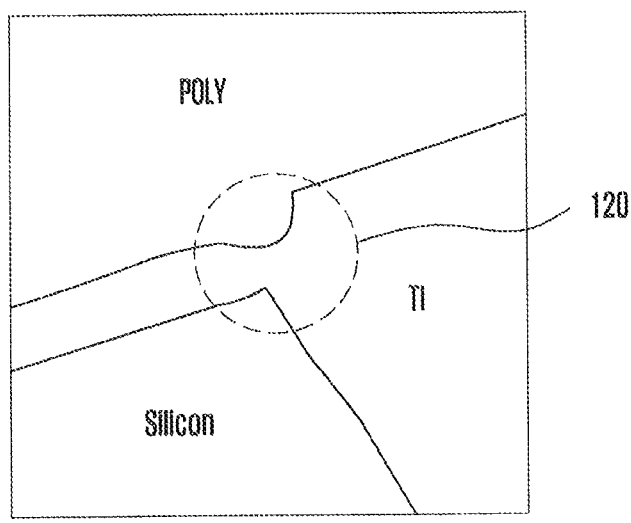
FIG. 3 is a cross-sectional view of the typical semiconductor device.
Figure 4:
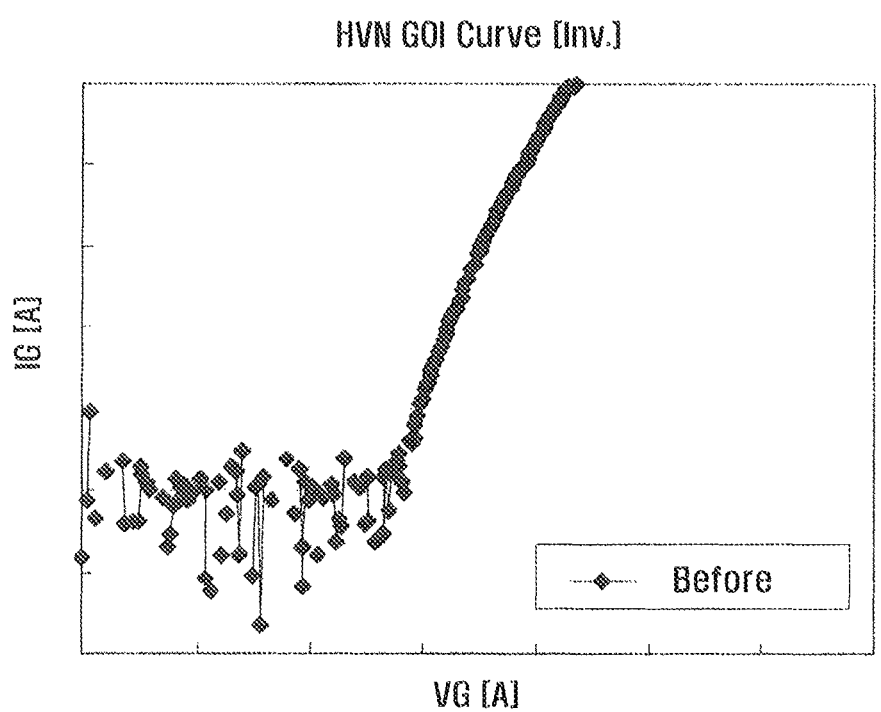
FIG. 4 is a graph showing gate oxide integrity (GOI) analysis result of a semiconductor device according to the related art.

Other objects and advantages of the present invention can be understood by the following description, and become apparent with reference to the embodiments of the present invention. In the drawings, the thickness of layers and regions and gap are exaggerated for clarity and convenience. It will be understood that when a layer is referred to as being "on" another layer, it can be directly on the other layer or intervening layer may also be present. Also, a third layer may be interposed therebetween. Through the specification, like reference numerals designate like elements. If a reference numeral includes alphabets, it denotes the same layer is modified by etching or polishing process.

Figure 7A:
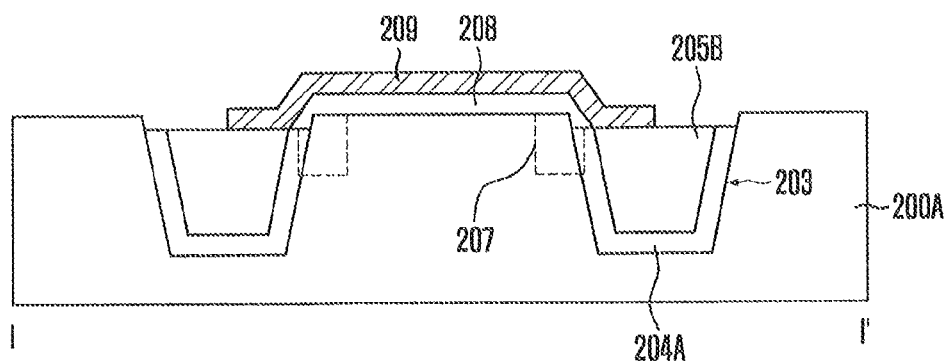
FIGS. 7A and 7B are cross-sectional views of FIG. 6 taken along the lines I-I' and II-II'.
Figure 7B:
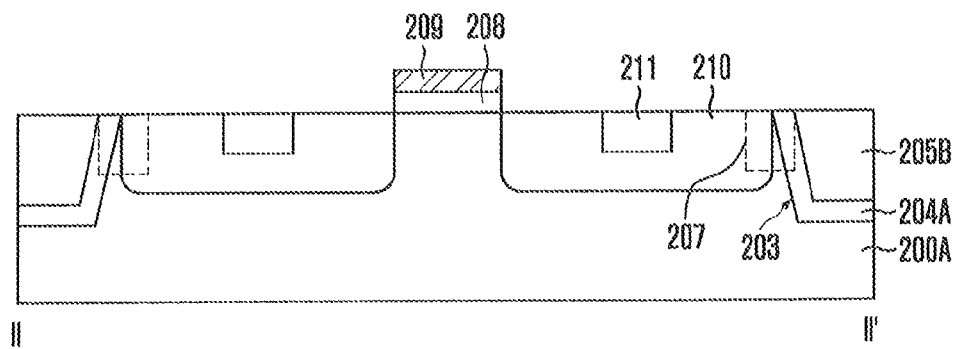

FIG. 6 is a plane view of a semiconductor device in accordance with a first embodiment of the present invention, and FIGS. 7A and 7B are cross-sectional views illustrating the semiconductor device of FIG. 6 taken along the lines I-I' and II-II'.

Referring to FIGS. 6 to 7B, the semiconductor device according to the first embodiment includes a substrate 200A having a trench 203 and a pro-oxidant region 207 formed at an upper corner portion of the trench 203.

The pro-oxidant region 207 is formed to enhance oxidation (growth rate) at a predetermined portion, particularly, an upper corner portion of the trench in an oxidation process for forming a gate insulation layer 208. The pro-oxidant region 207 may be formed by implanting impurity ions having a conductive type identical to or different from that of the substrate 200A. Also, the pro-oxidant region 207 may be formed at concentration higher than impurity concentration of the substrate 200A for further enhancing the oxidation if the pro-oxidation region 207 is formed by implanting impurity ions having the same conductive type of the substrate 200A. For example, the pro-oxidant region 207 is formed at concentration higher than concentration of a well if the substrate 200A includes the well (not shown). Furthermore, the pro-oxidant region 207 is formed at a shallower depth from the top surface of the substrate 200A than the trench 208.

The semiconductor device according to the first embodiment further includes an isolation layer 205B buried in the trench 203, a gate insulation layer 208 formed by oxidizing the substrate 200A, and a gate conductive layer 209 formed on the gate insulation layer 208. The gate insulation layer 208 is formed on an active region defined by the trench 203. The semiconductor device according to the first embodiment further includes a source and drain region 210 formed on active regions exposed at both sides of the gate conductive layer 209, and a junction region 211.

The active region has a box type. The gate conductive layer 209 is formed in a direction that crosses the active region. The gate conductive layer 209 may be formed in a short-axis direction of the active region.

The pro-oxidant region 207 is formed to surround an outline of the active region. Here, the pro-oxidant region 207 may be formed in the isolation layer 205B as well as the active region. In this case, the pro-oxidant region 207 is formed in a sidewall passivation layer 204A formed between the active region and the isolation layer 205B.

Also, the pro-oxidant region 207 may be formed at a region where the gate conductive layer 209 overlaps with the active region. The pro-oxidant region 207 may be formed in the isolation layer 205B as well as the active region. In this case, the pro-oxidant region 207 is formed in the sidewall passivation layer 204A formed between the active region and the isolation layer 205B. In addition, the pro-oxidant region 207 may be selectively formed only in the active region except the isolation layer 205B.

Hereinafter, a method for fabricating a semiconductor device according to the first embodiment of the present invention will be described.

FIGS. 8A to 8E are cross-sectional views describing a method for fabricating a semiconductor device in accordance with the first embodiment of the present invention.

Figure 8A:
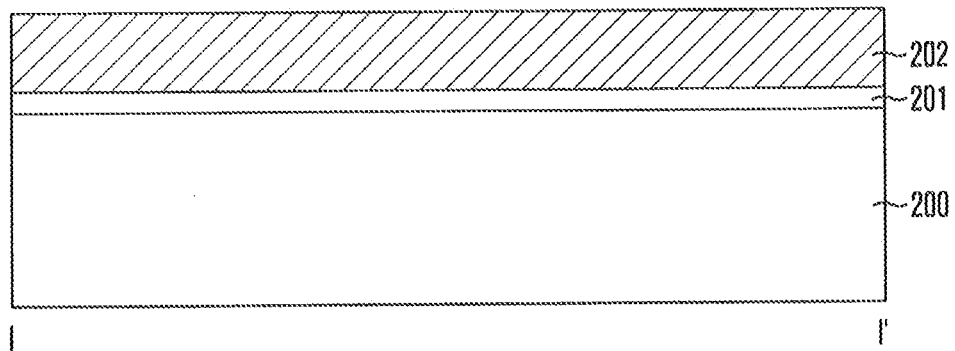
FIGS. 8A to 8E are cross-sectional views describing a method for fabricating a semiconductor device in accordance with the first embodiment of the present invention.

As shown in FIG. 8A, a substrate 200 is prepared. The substrate 200 is a semiconductor substrate made of one selected from the group consisting of Si, Ge, SiGe, GaP, GaAs, SiC, SiGeC, InAs, and InP. Also, the substrate 200 has a p-type or an n-type.

Then, an ion implantation process for controlling a threshold voltage in a channel region is performed after forming a well in the substrate 200.

A pad oxide layer 201 as a buffer layer and a pad nitride layer 202 as a hard mask are formed on the substrate 200. The pad oxide layer 201 is formed to prevent the surface of the substrate 200 from being damaged when depositing the pad nitride layer 202.

The pad oxide layer 201 is formed through an oxidation process. For example, a silicon oxide layer is formed. The pad nitride layer 202 is formed through a low pressure chemical vapor deposition (LPCVD) process for minimizing stress applied to the substrate 200 when depositing the pad nitride layer. For example, the pad nitride layer 202 is made of a silicon nitride layer. Or, the pad nitride layer may be a multilayer stacked of a nitride layer (silicon nitride layer), an oxide layer (silicon oxidation layer), and an oxynitride layer (silicon oxynitride layer SiON).

Figure 8B:
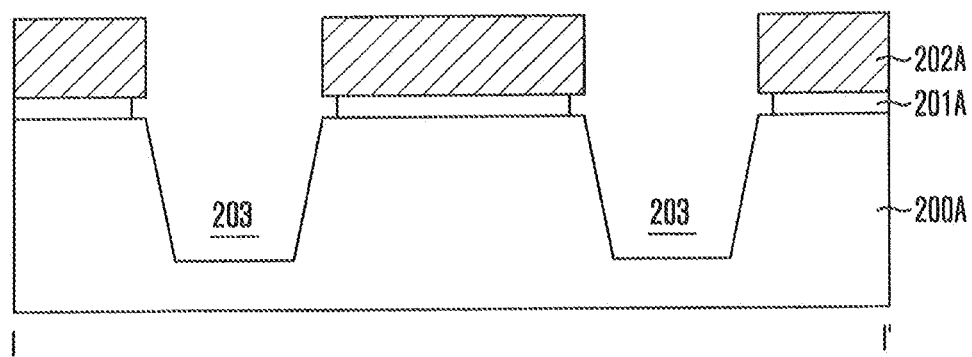

As shown in FIG. 8B, the trench 203 is formed through etching.

The trench 203 is formed as follows. A pad nitride layer pattern 202A is formed using an etch mask such as a photoresist pattern for forming a trench. Then, a pad oxide layer pattern 201A is formed using the pad nitride pattern 202A. A plurality of trenches 203 are formed in the substrate 203 by etching a portion of the substrate 200A. Here, a dry etch process is performed for a vertical profile of an inner surface of the trench 203, that is, an etch surface. For example, the dry etch process is performed using a plasma etch equipment.

Also, a hydrogen bromide (HBr) gas or a chlorine ($Cl_2$) gas is used as an etch gas. Or, gas mixture of $HBr/Cl_2/O_2$ may be used as the etch gas.

Figure 8C:
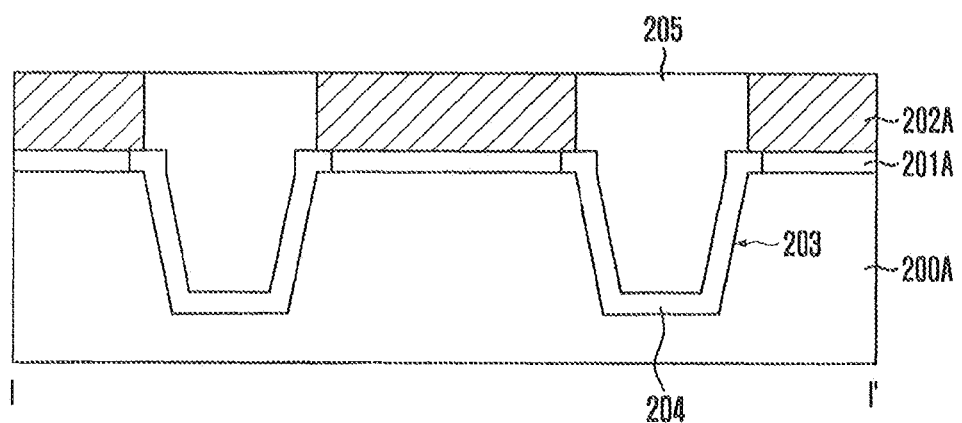

As shown in FIG. 8C, a sidewall passivation layer 204 is formed on an inner side of the trench 203. The sidewall passivation layer 204 is formed by rounding the etch surface, that is, the inner side of the trench 203 and performing an oxidation process for preventing electric field from concentrating at a corner. For example, a silicon oxide layer is formed through a dry etch process or a wet etch process.

Then, an isolation layer 205 is formed until the trench 203 is buried. Here, the isolation layer 205 may be formed as a un-doped silicate glass (USG) layer using high density plasma-chemical vapor deposition (HDP-CVD) providing a superior filling-up character even in a high aspect ratio. Or, the isolation layer 205 may be formed in a stacking structure of the HOP layer and a spin on dielectric (SOD) layer. Here, a polisilazane (PSZ) layer may be used as the SOD layer. In addition, material that can be formed through a spin coating scheme may be used. Also, the isolation layer 205 may be formed of BoronPhosphoSilicate Glass (BPSG), PhosphoSilicate Glass (PSG), Tetra Ethyle Ortho Silicate (TEOS), or a stack layer thereof.

Figure 8D:
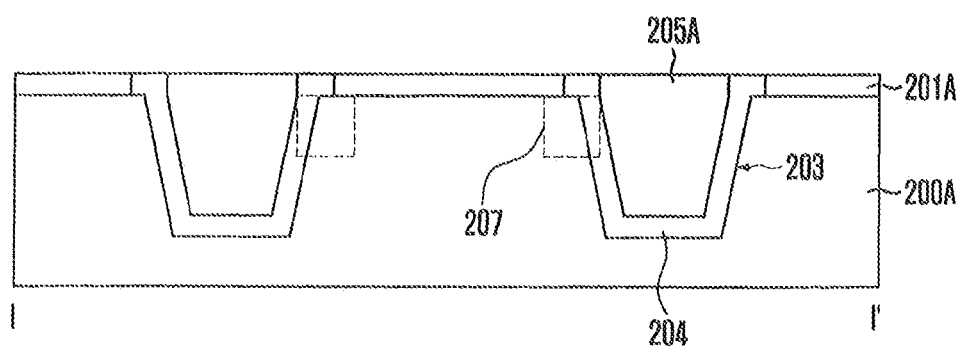

As shown in FIG. 8D, the pad nitride layer pattern 202A (see FIG. 8C) is selectively removed. The process of removing the pad nitride pattern 202A uses a phosphoric acid solution ($H_3PO_4$).

Then, a cleaning process may be performed. The cleaning process uses a Buffered Oxide Etchant (BOE) solution or a Diluted HF (DHF) solution for removing foreign substance such as particles.

Meanwhile, the isolation layer 205A may be recessed at the height of the pad oxide layer 201A because the isolation layer 205A is etched at a predetermined thickness through the process of removing the pad nitride layer pattern 202A and the cleaning process.

Then, a pro-oxidant region 207 is formed at an upper corner portion of the trench 203. The pro-oxidant region 207 is formed by implanting impurity ions having a conductive type identical to or different from the substrate 200A. Also, the pro-oxidant region 207 is formed at concentration higher than the impurity concentration of the substrate 200A. Also, the pro-oxidant region 207 is formed at a shallower depth from the top surface of the substrate 200A than the trench 203. Here, the pro-oxidant region 207 may be formed through ion implantation or diffusion. For example, the ion implantation process is performed using boron (B), which is a group III element, and phosphorus (P) and arsenic (As), which are group VI elements. The diffusion process diffuses boron (B) using an impurity gas $B_2H_6$ or diffuses arsenic (As) using an impurity gas $PH_4$. Here, an argon gas (Ar) and a nitrogen gas ($N_2$) are used as a transport gas.

Figure 8E:
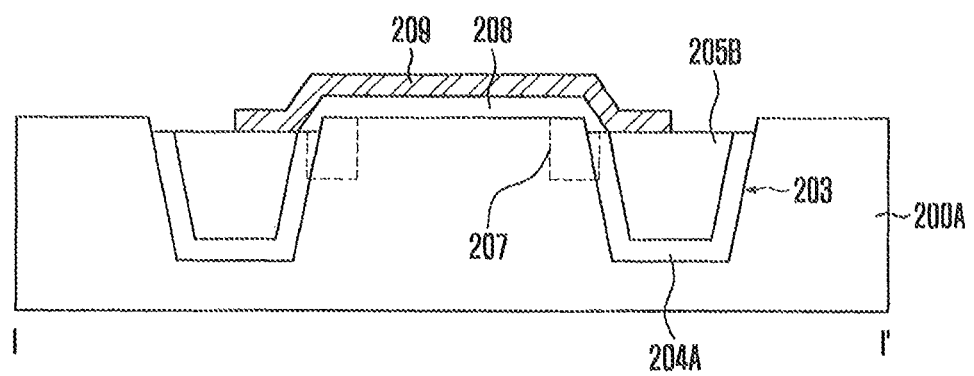

As shown in FIG. 8E, the pad oxide layer 201A (see FIG. 8D) is removed. In this step, the isolation layer 205B may be recessed at a predetermined depth. Therefore, the isolation layer 205B may be lower than the top surface of the substrate 200A.

Then, a gate insulation layer 208 is formed on the substrate 200A. Here, the gate insulation layer 208 is formed by oxidizing the substrate 200A. For example, the gate insulation layer 208 is formed of a silicon oxide layer. After forming the silicon oxide layer, a nitride layer may be further formed on an interface between the silicon oxide layer and the substrate 200A by performing a thermal process using a nitrogen gas ($N_2$) after forming the silicon oxide layer. A dry oxidation process, a wet oxidation process, or a radical ion oxidation process may be performed for oxidizing the substrate 200A. It is preferable to perform the dry oxidation process and the wet oxidation process instead of the radical ion oxidation process.

Then, a gate conductive layer 209 is formed on the gate insulation layer 208. The gate conductive layer 209 is made of one selected from the group consisting of a polysilicon layer, a transition metal, and rare earth element metals. The gate conductive layer 209 may made of a polysilicon layer that has a superior interface character with the gate insulation layer 208 and can be etched easier than metal. For example, the polysilicon layer is formed through the LPCVD method. A $SiH_4$ gas is used as a source gas, and a $PH_3$ gas is used as a doping gas. Also, iron (Fe), cobalt (Co), tungsten (W), nickel (Ni), palladium (Pd), white gold (Pt), molybdenum (Mo), or titanium (Ti) is used as the transition metal.

Also, erbium (Er), ytterbium (Yb), samarium (Sm), yttrium (Y), lanthanum (La), cerium (Ce), terbium (Tb), dysprosium (Dy), holmium (Ho), thulium (Tm), and lutetium (Lu), are used as the rare earth element.

Figure 9:
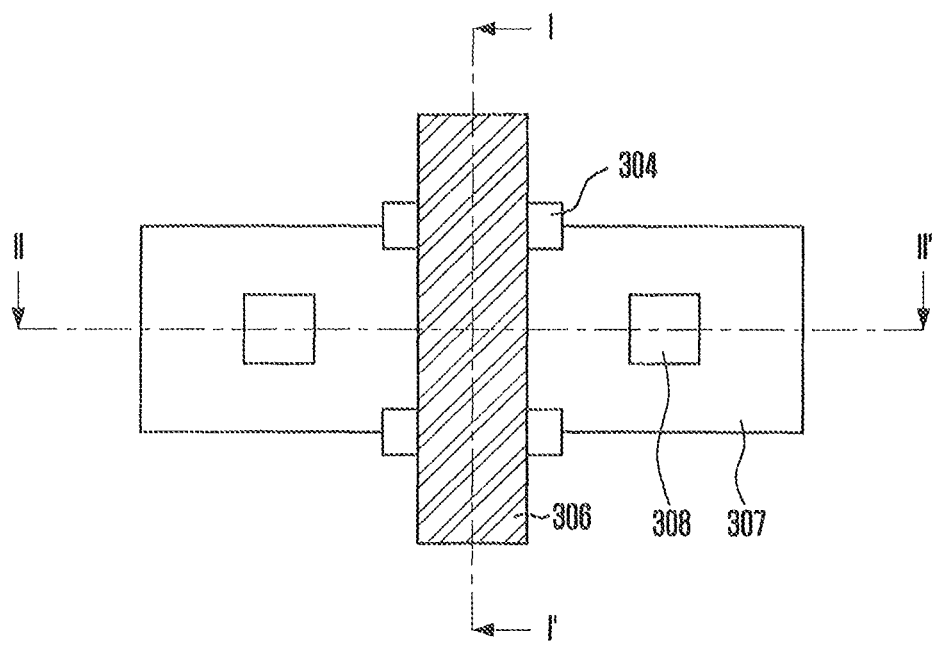
FIG. 9 is a plane view of a semiconductor device in accordance with a second embodiment of the present invention.
Figure 10A:
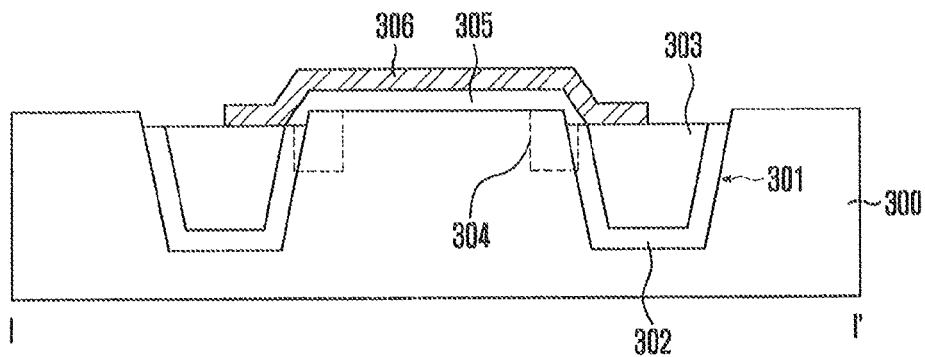
FIGS. 10A and 10B are cross-sectional views of FIG. 9 taken along the lines I-I' and II-II'.
Figure 10B:
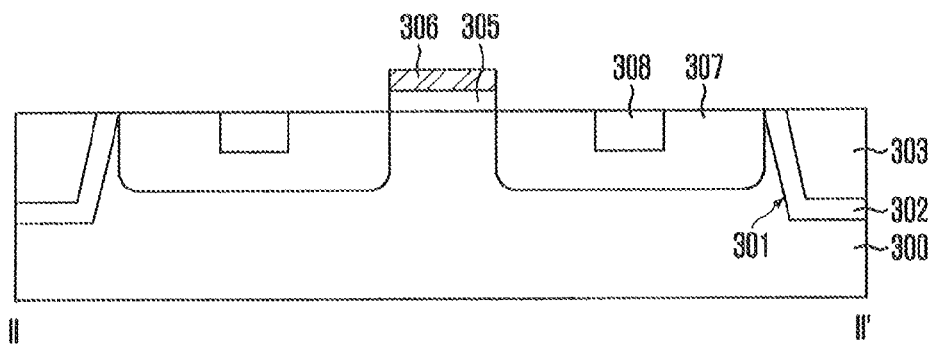

FIG. 9 is a plane view of a semiconductor device in accordance with a second embodiment of the present invention, and FIGS. 10A and 10B are cross-sectional views of FIG. 9 taken along the lines I-I' and II-II'.

Referring to FIGS. 9 to 10B, the semiconductor device according to the second embodiment basically has a structure identical to the first embodiment. Unlike the first embodiment that the pro-oxidant region 207 is formed to surround the outline of the active region, a pro-oxidant region 304 of the second embodiment is locally formed in a bar type at a region where a gate conductive layer 306 overlaps with an active region. Here, the pro-oxidant region 304 is formed in the active region and the isolation layer 303.

Since the other constituent elements of the second embodiment are identical to those of the first embodiment, the detail descriptions thereof are omitted. In FIGS. 9 and 10, a reference numeral 301 denotes a trench, a reference numeral 302 denotes a sidewall passivation layer, a reference numeral 303 is an isolation layer, a reference numeral 305 is a gate insulation layer, a reference numeral 307 is a source and drain region, and a reference numeral 308 is a junction region.

Figure 12A:
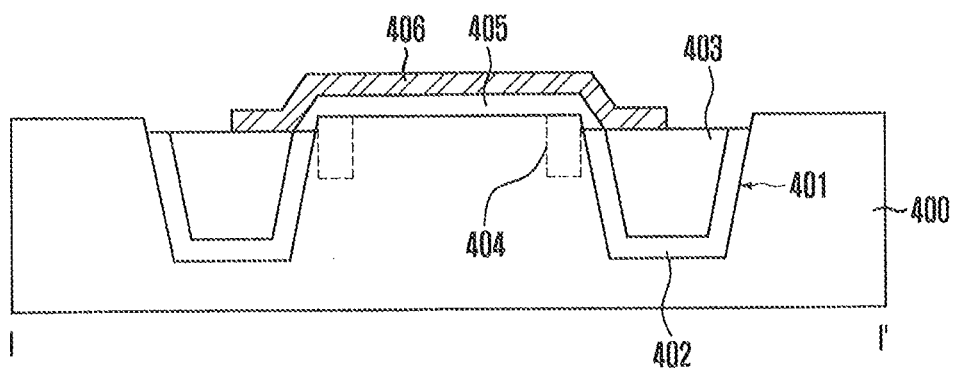
FIGS. 12A and 12B are cross-sectional views of FIG. 10 taken along the lines I-I' and II-II'.

FIG. 11 is a plane view of a semiconductor device in accordance with a third embodiment of the present invention, and FIGS. 12A and 10B are cross-sectional views of FIG. 11 taken along the lines I-I' and II-II'.

Figure 12B:
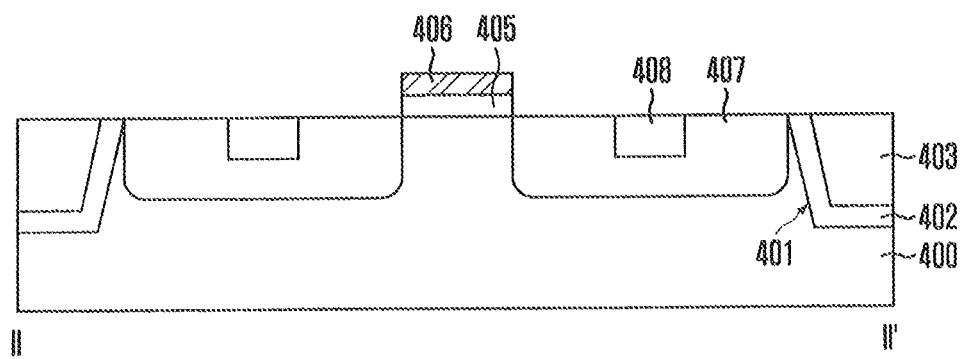

Referring to FIGS. 11 to 12B, a pro-oxidant region 404 of the semiconductor device according to the third embodiment is locally formed in a bar type at a region where a gate conductive layer 406 overlaps with an active region like the pro-oxidant region 404 of the second embodiment. The pro-oxidant region 404 is formed only in an active region.

Since other constituent elements are identical to those of the first embodiment, the detail descriptions thereof are omitted. In FIGS. 10 and 11, a reference numeral 401 denotes a trench, a reference numeral 402 is a sidewall passivation layer, a reference numeral 403 is an isolation layer, a reference numeral 405 is a gate insulation layer, a reference numeral 407 is a source and drain region, and a reference numeral 408 is a junction region.

Hereinafter, effects of the first to third embodiments of the present invention will be described.

Figure 13:
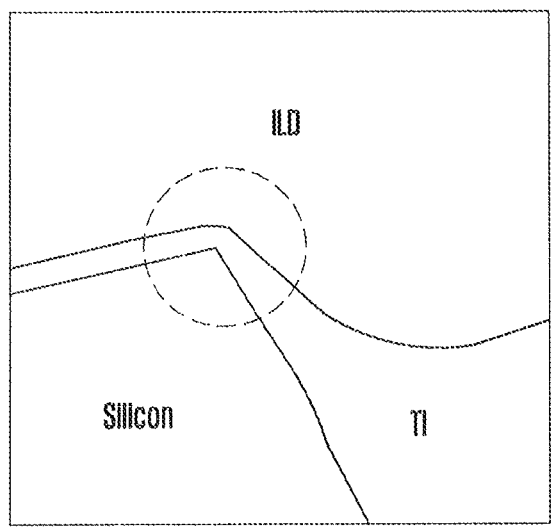
FIG. 13 is a cross-sectional view of a semiconductor device employing embodiments of the present invention.
Figure 14:
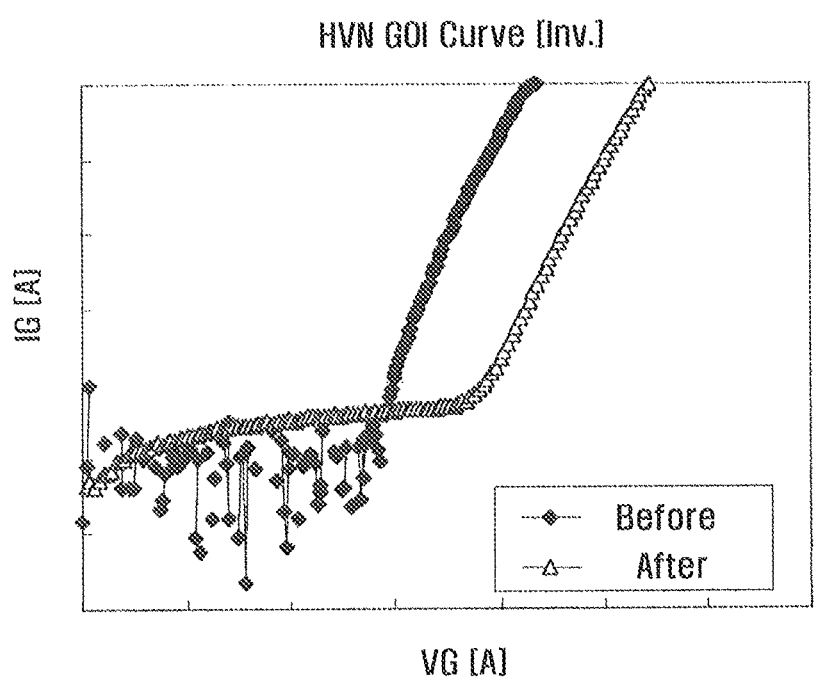
FIG. 14 is a graph showing GOI analysis result of a semiconductor device employing embodiments of the present invention.
Figure 15:
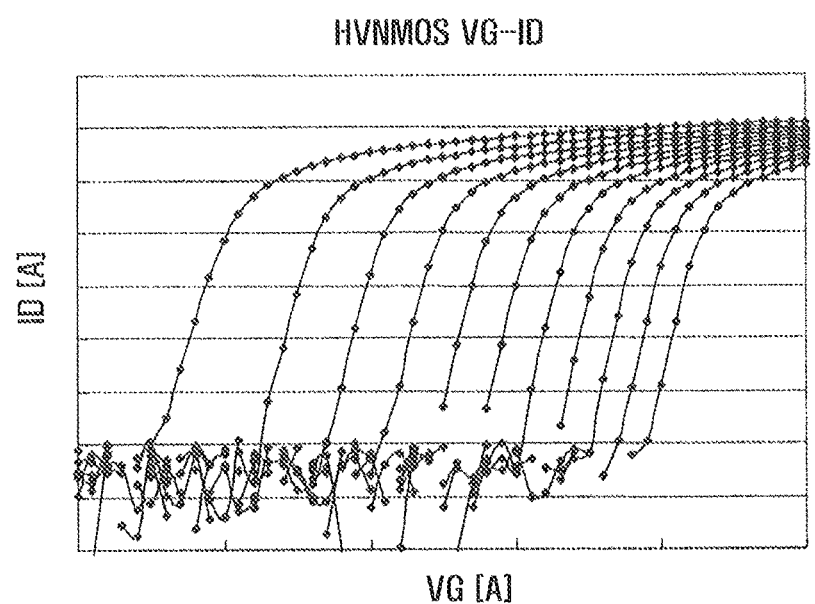
FIG. 15 is a graph showing I-V character of a semiconductor device employing embodiments of the present invention.

FIG. 13 is a cross-sectional view of a semiconductor device employing embodiments of the present invention. FIG. 14 is a graph showing GOI analysis result of a semiconductor device employing embodiments of the present invention, and FIG. 15 is a graph showing I-V character of a semiconductor device employing embodiments of the present invention.

FIG. 13 clearly shows the gate insulation layer formed at the upper corner portion of the trench at a uniform thickness. That is, the pro-oxidant region enables the gate insulation layer to be stably grown at the upper corner portion of the trench.

The GOI analysis result graph of FIG. 14 clearly shows that the GOI characteristic is significantly improved when the embodiments of the present invention are applied (After) compared to GOI characteristic of the related art. That is, the breakdown voltage is improved significantly when the embodiments of the present invention are applied, compared to the related art. As shown in FIG. 15, an ideal V-I curve can be obtained if the embodiments of the present invention are applied, compared to the related art (see FIG. 5).

Embodiments of the present invention relate to a semiconductor device and a fabricating method thereof. In the present invention, a pro-oxidant region is formed at an upper corner region of a trench in order to enhance the growth of a gate insulation layer at the upper corner portion of the trench for forming the gate insulation layer at a uniform thickness. Therefore, GOI character and I-V character can be improved as well as a breakdown voltage.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
   a substrate having a trench that defines an active region;
   a sidewall passivation layer formed by oxidizing an inner side of the trench;
   an isolation layer that buries the trench;
   a pro-oxidant region formed in the active region and the sidewall passivation layer at an upper corner portion of the trench to enhance oxidation at the upper corner portion of the trench;
   a gate insulation layer formed on the active region and the sidewall passivation layer; and
   a gate conductive layer formed on the gate insulation layer,
   wherein the gate insulation layer, has a thickness which is uniform over all the range of the gate insulation layer.

2. The semiconductor device of claim 1, wherein the pro-oxidant region is formed at concentration higher than the substrate.

3. The semiconductor device of claim 2, wherein the pro-oxidant region is formed by implanting one selected from the group consisting of boron ion (B), phosphorus ion (P), and arsenic ion (As).

4. The semiconductor device of claim 1, wherein the gate conductive layer is formed in a direction crossing the active region.

5. The semiconductor device of claim 4, wherein the pro-oxidant region is formed to surround the active regions.

6. The semiconductor device of claim 4, wherein the pro-oxidant region is formed in a bar type at a region where the gate conductive layer overlaps with the active region.

7. The semiconductor device of claim 1, wherein the isolation layer is formed to be lower than a top surface of the substrate.

8. The semiconductor device of claim 1, the gate insulation layer is formed to cover the upper corner portion of the trench.

9. The semiconductor device of claim 1, further comprising a nitride layer formed on an interface between the gate insulation layer and the substrate.

10. The semiconductor device of claim 1, wherein the pro-oxidant region is partially overlapping a portion of the sidewall passivation layer.

11. A method for fabricating a semiconductor device, comprising:
    defining an active region by forming a trench in a substrate;
    forming a sidewall passivation layer by oxidizing an inner side of the trench;
    forming an isolation layer in the trench;
    forming a pro-oxidant region in the active region and the sidewall passivation layer at an upper corner portion of the trench filled with the isolation layer;
    forming a gate insulation layer; and
    forming a gate conductive layer on the gate insulation layer,
    wherein the gate insulation layer, has a thickness which is uniform over all the range of the gate insulation layer.

12. The method of claim 11, wherein the pro-oxidant region is formed at concentration higher than the substrate.

13. The method of claim 12, wherein the pro-oxidant region is formed by implanting one selected from the group consisting of boron ion (B), phosphorus ion (P), and arsenic ion (As).

14. The method of claim 11, wherein the gate conductive layer is formed in a direction crossing the active region.

15. The method of claim 14, wherein the pro-oxidant region is formed to surround the active region.

16. The method of claim 11, wherein the pro-oxidant region is formed in a bar type at a region where the gate conductive layer overlaps with the active region.

17. The method of claim 11, wherein the isolation layer is formed to be lower than a top surface of the substrate.

18. The method of claim 11, wherein the pro-oxidant region is partially overlapping a portion of the sidewall passivation layer.

* * * * *